(12) United States Patent
Ahn et al.

(10) Patent No.: US 11,632,858 B2
(45) Date of Patent: Apr. 18, 2023

(54) ANODIC ALUMINUM OXIDE STRUCTURE

(71) Applicant: POINT ENGINEERING CO., LTD., Asan-si (KR)

(72) Inventors: Bum Mo Ahn, Suwon-si (KR); Seung Ho Park, Hwaseong-si (KR); Dong Eun Lee, Pyeongtaek-si (KR)

(73) Assignee: POINT ENGINEERING CO., LTD.

( * ) Notice: Subject to any disclaimer, the term of this patent is extended or adjusted under 35 U.S.C. 154(b) by 0 days.

(21) Appl. No.: 17/209,178

(22) Filed: Mar. 22, 2021

(65) Prior Publication Data

US 2021/0307159 A1    Sep. 30, 2021

(30) Foreign Application Priority Data

Mar. 30, 2020  (KR) .................. 10-2020-0038092

(51) Int. Cl.
| | | |
|---|---|---|
| *H05K 1/03* | (2006.01) | |
| *H05K 1/11* | (2006.01) | |
| *G01R 1/073* | (2006.01) | |

(52) U.S. Cl.
CPC ........... *H05K 1/0306* (2013.01); *H05K 1/115* (2013.01); *G01R 1/07342* (2013.01)

(58) Field of Classification Search
CPC ... H05K 2201/0275; H05K 2201/0281; H05K 2201/0287; H05K 2201/0296; H05K 2201/0347; H05K 2201/09481; H05K 2201/09563; H05K 2201/09609; H05K 2201/09618; H05K 2201/09645; H05K 2201/0979; H05K 1/0251; H05K 1/02; H05K 1/71; H05K 1/0306; H05K 1/112; H05K 1/113; H05K 1/115; H05K 1/0201; H05K 1/0204; H05K 1/0206; H05K 1/025
See application file for complete search history.

(56) References Cited

U.S. PATENT DOCUMENTS

| | | | | |
|---|---|---|---|---|
| 3,327,284 A | * | 6/1967 | Crimmins .............. | H05K 3/308 439/389 |
| 4,642,889 A | * | 2/1987 | Grabbe .................. | H01R 12/57 29/840 |
| 5,281,771 A | * | 1/1994 | Swift ..................... | H05K 3/368 174/262 |
| 6,388,208 B1 | * | 5/2002 | Kiani ................... | H05K 1/0222 174/260 |
| 7,220,131 B1 | * | 5/2007 | Pecht ..................... | H01L 24/10 439/65 |

(Continued)

FOREIGN PATENT DOCUMENTS

| | | | | |
|---|---|---|---|---|
| EP | 1030544 A1 | * | 8/2000 | .............. B32B 3/00 |
| JP | 6100617 B2 | | 3/2017 | |

(Continued)

OTHER PUBLICATIONS

KR-20170139318-A Translation (Year: 2021).*

*Primary Examiner* — Timothy J Thompson
*Assistant Examiner* — John B Freal
(74) *Attorney, Agent, or Firm* — Renaissance IP Law Group LLP

(57) ABSTRACT

Proposed is an anodic aluminum oxide structure made of anodic aluminum oxide and, more particularly, is an anodic aluminum oxide structure that minimizes damage to a material in the vicinity of a conductor and prevents a problem of delamination between the conductor and a member existing thereon.

7 Claims, 8 Drawing Sheets

(56) References Cited

U.S. PATENT DOCUMENTS

| | | | | |
|---|---|---|---|---|
| 2005/0172483 A1* | 8/2005 | Sugita | ............... | H05K 3/4069 |
| | | | | 523/303 |
| 2008/0029872 A1* | 2/2008 | Hsu | ............... | H05K 3/4038 |
| | | | | 257/E25.023 |
| 2011/0000708 A1* | 1/2011 | Nakai | ............... | C25D 5/022 |
| | | | | 174/266 |
| 2013/0048350 A1* | 2/2013 | Horiuchi | ............... | H05K 1/0287 |
| | | | | 174/255 |

FOREIGN PATENT DOCUMENTS

| | | | | |
|---|---|---|---|---|
| KR | 20170139318 A | * 12/2017 | ............... | H01G 4/10 |
| WO | WO-2011123717 A1 | * 10/2011 | ............... | H05K 1/0213 |

* cited by examiner

ANODIC ALUMINUM OXIDE STRUCTURE

CROSS REFERENCE TO RELATED APPLICATION

The present application claims priority to Korean Patent Application No. 10-2020-0038092, filed Mar. 30, 2020, the entire contents of which is incorporated herein for all purposes by this reference.

BACKGROUND

1. Technical Field

The present disclosure relates to an anodic aluminum oxide structure made of anodic aluminum oxide.

2. Description of the Related Art

A related-art multilayer wiring substrate may be configured to include a thin-film wiring part composed of a plurality of resin insulating layers and a thin-film conductor layer on a ceramic substrate.

Such a multilayer wiring substrate may be used for a probe card as an example. In this case, the multilayer wiring substrate compensates for a pitch difference between probes and a printed circuit board (PCB), and allows electrical inspection to be performed on a semiconductor device.

In the multilayer wiring substrate, the thin-film conductor layer composed of a plating layer may be provided between each of the plurality of insulating layers, and a via conductor may be provided through each of the insulating layers in a thickness direction thereof. In this case, the thin-film conductor layer may be provided so as to be in contact with an end of each of neighboring via conductors so that upper and lower neighboring thin-film conductor layers may be electrically connected to each other.

The insulating layers constituting the related-art multilayer wiring substrate are mainly made of sintered ceramic or resin.

In the case of a sintered ceramic insulating layer and a resin insulating layer, via holes are formed using a laser beam or micro-drill and thus are limited in size and shape.

In particular, in a multilayer wiring substrate composed of a resin insulating layer, an interlayer delamination problem may occur due to a difference in coefficient of thermal expansion between the resin insulating layer and a via conductor.

For example, the temperature of the multilayer wiring substrate may increase during a process carried out under high-temperature atmosphere. In this case, under the same high-temperature atmosphere condition, the via conductor may thermally expand to a greater extent than the resin insulating layer does. Due to such a difference in expansion between the via conductor and the resin insulating layer, a delamination problem may occur between respective resin insulating layers.

In addition, the via conductor may thermally also expand in a horizontal direction, causing a problem of damaging a resin insulating layer existing in the vicinity thereof.

The foregoing is intended merely to aid in the understanding of the background of the present disclosure, and is not intended to mean that the present disclosure falls within the purview of the related art that is already known to those skilled in the art.

SUMMARY

Accordingly, the present disclosure has been made keeping in mind the above problems occurring in the related art, and an objective of the present disclosure is to provide an anodic aluminum oxide structure including a vertical conductive part without a limitation on the shape and size of the vertical conductive part, thus having optimum characteristics required of a structure.

Another objective of the present disclosure is to provide an anodic aluminum oxide structure that minimizes damage to a material in the vicinity of a conductor provided therein due to thermal expansion of the conductor, and prevents a problem of delamination between the conductor and a member existing thereon.

Still another objective of the present disclosure is to provide an anodic aluminum oxide structure having excellent electrical conductivity.

In order to achieve the above objectives, according to one aspect of the present disclosure, there is provided an anodic aluminum oxide structure made of anodic aluminum oxide, the anodic aluminum oxide structure including: a surface conductive part provided on a surface of the anodic aluminum oxide; and a vertical conductive part connected to the surface conductive part and charged in a through-hole of the anodic aluminum oxide, wherein the vertical conductive part may be formed by a cluster of a plurality of tiny conductive parts.

Furthermore, at least one of the tiny conductive parts may include an angled edge.

Furthermore, a projection region of the plurality of tiny conductive parts with respect to the surface conductive part may be positioned inside the surface conductive part.

Furthermore, an area of a projection region of the plurality of tiny conductive parts with respect to the surface conductive part may be equal to or less than that of the surface conductive part.

Furthermore, the vertical conductive part may include a border conductive part surrounding the tiny conductive parts at a position outside the tiny conductive parts.

Furthermore, at least two of the tiny conductive parts may have different cross-sectional sizes.

Furthermore, at least two of the tiny conductive parts may have different shapes.

According to another aspect of the present disclosure, there is provided an anodic aluminum oxide structure made of anodic aluminum oxide, the anodic aluminum oxide structure including: a first surface conductive part provided on a first surface of the anodic aluminum oxide; a second surface conductive part provided on a second surface of the anodic aluminum oxide; and a vertical conductive part charged in a through-hole of the anodic aluminum oxide to connect the first and second surface conductive parts to each other, wherein the vertical conductive part may include an angled edge.

The anodic aluminum oxide structure according to the present disclosure can implement a vertical conductive part having optimum characteristics required of a structure by providing through-holes without a limitation on shape, size, and structure. In addition, the anodic aluminum oxide structure according to the present disclosure can exhibit an effect of preventing a delamination problem and an effect of improving electrical conductivity.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION

Figure 1A:
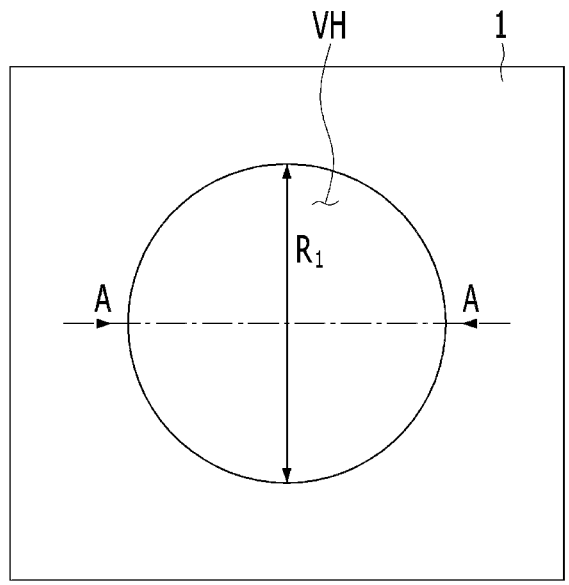
FIGS. 1A and 1B are views schematically illustrating the background and concept of the present disclosure, respectively.

Contents of the description below merely exemplify the principle of the present disclosure. Therefore, those of ordinary skill in the art may implement the theory of the present disclosure and invent various apparatuses which are included within the concept and the scope of the present disclosure even though it is not clearly explained or illustrated in the description. Furthermore, in principle, all the conditional terms and embodiments listed in this description are clearly intended for the purpose of understanding the concept of the present disclosure, and one should understand that the present disclosure is not limited the exemplary embodiments and the conditions.

The above described objectives, features, and advantages will be more apparent through the following detailed description related to the accompanying drawings, and thus those of ordinary skill in the art may easily implement the technical spirit of the present disclosure.

The embodiments of the present disclosure will be described with reference to cross-sectional views and/or perspective views which schematically illustrate ideal embodiments of the present disclosure. For explicit and convenient description of the technical content, sizes or thicknesses of films and regions and diameters of holes in the figures may be exaggerated. Therefore, variations from the shapes of the illustrations as a result, for example, of manufacturing techniques and/or tolerances, are to be expected.

Thus, the embodiments should not be construed as limited to the particular shapes of regions illustrated herein but are to include deviations in shapes that result, for example, from manufacturing.

In describing various embodiments, the same reference numerals will be used throughout different embodiments and the description to refer to the same or like elements or parts. An anodic aluminum oxide structure according to an exemplary embodiment of the present disclosure may include a through-hole provided by etching. This through-hole is not limited in its shape and structure. Therefore, the anodic aluminum oxide structure according to the exemplary embodiment of the present disclosure may include a vertical conductive part provided in the through-hole by etching the through-hole without a limitation on shape and structure.

The anodic aluminum oxide structure according to the exemplary embodiment of the present disclosure may be used as a multilayer wiring substrate constituting a probe card as an example. In the semiconductor field using a probe card, it is required to develop a technology for a multilayer wiring substrate having a high degree of electrical conductivity while solving the problem of delamination between layers.

The anodic aluminum oxide structure according to the exemplary embodiment of the present disclosure may be made of anodic aluminum oxide AAO, thereby eliminating a limitation on the shape, size, and structure of the through-hole. Therefore, in the anodic aluminum oxide structure according to the exemplary embodiment of the present disclosure, by providing the vertical conductive part in the through-hole having a high degree of freedom in terms of shape, size, and structure, it is possible to solve the delamination problem and implementing a structure having a high degree of electrical conductivity.

Hereinafter, the anodic aluminum oxide structure according to the exemplary embodiment of the present disclosure will be described in detail with reference to the accompanying drawings.

Figure 1B:
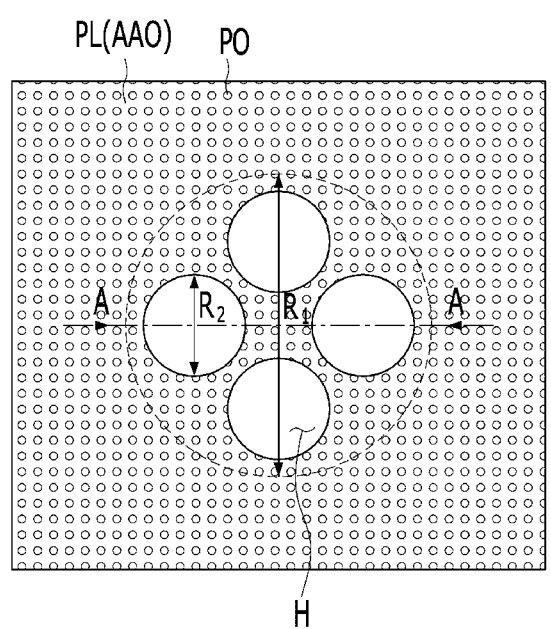

FIGS. 1A and 1B are views schematically illustrating the background and concept of the present disclosure, respectively.

FIG. 1A is a view illustrating a via conductor hole VH formed by a mechanical hole processing method in a related-art wiring substrate composed of a resin insulating layer as viewed from above, and FIG. 1B is a view illustrating a through-hole H formed by etching an anodic aluminum oxide structure according to the exemplary embodiment of the present disclosure as viewed from above.

As illustrated in FIG. 1A, a wiring substrate composed of a resin insulating layer 1 may be the related-art wiring substrate.

In order to form the via conductor hole VH passing through the resin insulating layer 1 in a thickness direction thereof, a mechanical processing method using a laser beam or drill may be used. The mechanical processing method may have a limitation on the shape, size, and structure of a hole in that the laser beam or drill is used.

Specifically, the hole formed by the mechanical processing method may mainly have a circular cross-section, or may be formed in a shape that does not include an edge where two surfaces meet. In addition, in the mechanical processing method, it is difficult to form a hole of a small size, and it is required to form holes at a pitch interval P taking into account a mechanical error, so there may be a limitation on the structure of the hole.

Therefore, the via conductor hole VH of the related-art wiring substrate may be provided only in a limited shape, size, and structure.

The via conductor hole VH illustrated in FIG. 1A is a hole formed by a mechanical processing method, and may be formed in a shape having a circular cross-section with a diameter of R1, for example.

Meanwhile, the through-hole H illustrated in FIG. 1B is a hole formed by an etching method, and a plurality of through-holes H may formed so that each of the through-holes H may have a diameter R2 smaller than the diameter R1 of the via conductor hole VH illustrated in FIG. 1A. In this case, the plurality of through-holes H may be formed within a size equal to that of the cross-sectional area of the via conductor hole VH with the diameter R1 illustrated in FIG. 1A.

The anodic aluminum oxide AAO includes a porous layer PL having pores PO, and a barrier layer BL provided on a surface of the porous layer PL and having no pores PO. In FIG. 1B, as an example, it is illustrated that the anodic aluminum oxide AAO includes only the porous layer PL from which the barrier layer BL has been removed, and the through-holes H passing therethrough in a thickness direction of the porous layer PL is provided. Therefore, as illustrated in FIG. 1B, a plurality of open pores PO may exist in the vicinity of openings of the through-holes H.

Alternatively, in another example, the anodic aluminum oxide AAO may include a porous layer PL and a barrier layer BL provided on the porous layer PL. When through-holes H are provided in this anodic aluminum oxide AAO, a surface of the anodic aluminum oxide AAO may exist in a form in which openings of pores PO are closed by the barrier layer BL. The anodic aluminum oxide structure according to the exemplary embodiment of the present disclosure may include both the two types of the anodic aluminum oxide AAO structures described above.

On an upper surface of the anodic aluminum oxide AAO, a photosensitive material may be provided, and then a photoresist process may be performed. At least a part of the photosensitive material may be patterned and removed by the photoresist process. The anodic aluminum oxide AAO may be subjected to an etching process in a region from which the at least the part of the photosensitive material has been removed by patterning. Through this process, the through-holes H may be provided in the anodic aluminum oxide structure according to the exemplary embodiment of the present disclosure.

In this case, the through-holes H may be provided according to patterns resulting from patterning of the photosensitive material provided on the upper surface of the anodic aluminum oxide AAO. The photosensitive material is not limited in size and shape of the region to be patterned. Therefore, since the through-holes H may be formed by patterning the photosensitive material and performing the etching process on the anodic aluminum oxide AAO through the region from which the at least the part of the photosensitive material has been removed by patterning, there is no limitation on the size and shape thereof.

As illustrated in FIG. 1B, the plurality of through-holes H may be formed in an area having a size equal to that of a cross-sectional area having the diameter of R1 so as to each have the small diameter R2. The plurality of through-holes H may be formed with a predetermined pitch interval P, and at least two through-holes H may be formed with a regular pitch interval P.

As illustrated in FIG. 1B, etching of the anodic aluminum oxide AAO may result in formation of the through-holes H without a limitation on the shape, size, and structure of the holes. When the anodic aluminum oxide AAO is wet-etched with an etchant, the through-holes H each having a vertical inner wall may be formed, and each of the through-holes H may have the same shape as an opening region of the photosensitive material. Therefore, it is possible to provide the through-holes H without a limitation on the shape, size, and structure of the holes.

The anodic aluminum oxide structure according to the exemplary embodiment of the present disclosure may include the through-holes H that are freely provided in a shape, size, and structure according to the purpose required for the above-described multilayer wiring substrate. The multilayer wiring substrate may be mainly required to achieve the purpose of preventing an interlayer delamination problem and/or improving electrical conductivity. Therefore, when used as the multilayer wiring substrate, the anodic aluminum oxide structure according to the exemplary embodiment of the present disclosure may achieve the purpose of preventing the interlayer delamination problem and improving electrical conductivity.

The anodic aluminum oxide structure according to the exemplary embodiment of the present disclosure may include the through-holes H that are provided in different shapes, sizes, and structures according to its main purpose.

Specifically, when the main purpose of the anodic aluminum oxide structure according to the exemplary embodiment of the present disclosure is to prevent the interlayer delamination problem, the through-holes H may be provided in a suitable shape, size, and structure in consideration of thermal expansion of the respective vertical conductive parts 12 provided in the through-holes H.

On the other hand, when the main purpose of the anodic aluminum oxide structure according to the exemplary embodiment of the present disclosure is to improve the electrical conductivity, the through-holes H each having the vertical conductive part 12 therein may be provided in a suitable shape, size, and structure to have a cross-sectional area capable of improving the electrical conductivity.

Figure 2A:
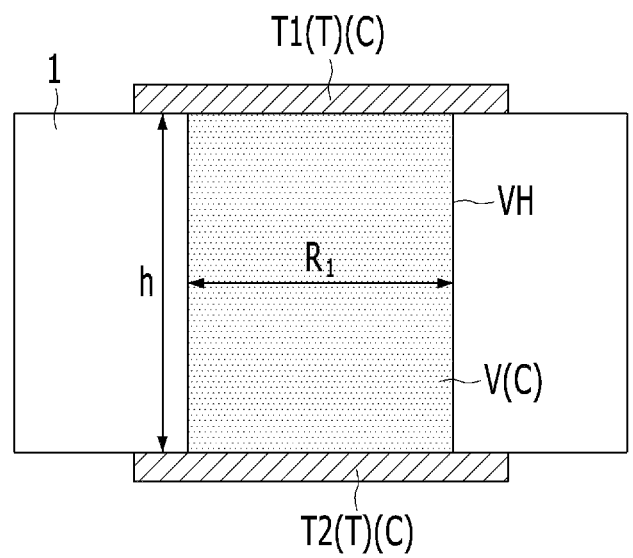
FIGS. 2A and 2B are views illustrating cut surfaces of a conductor part of a related-art wiring substrate and a conductive part of an anodic aluminum oxide structure according to an exemplary embodiment of the present disclosure, taken along line 'A-A' of FIG. 1A and line 'A-A' of FIG. 1B, respectively.
Figure 2B:
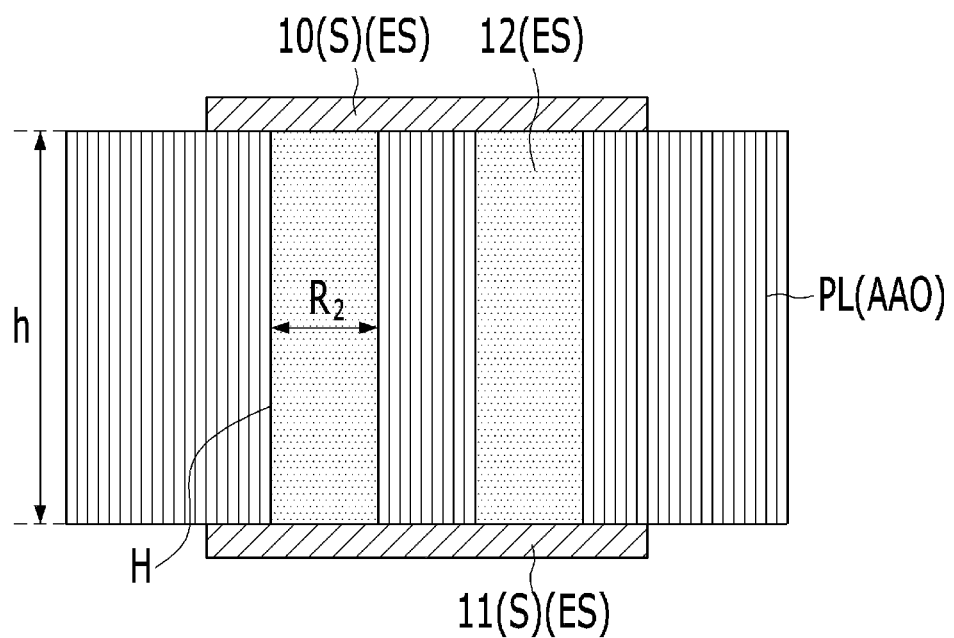

FIG. 2A is a view illustrating a structure in which thin-film conductor layers T are provided on top and bottom of a cut surface taken along line 'A-A' of FIG. 1A, and FIG. 2B is a view illustrating a structure in which surface conductive parts S are provided on top and bottom of a cut surface taken along line 'A-A' of FIG. 1B.

As illustrated in FIG. 2A, the related-art wiring substrate includes the resin insulating layer 1, and the conductor part C composed of a via conductor V provided in the via conductor hole VH and a thin-film conductor layer T provided on a surface of the resin insulating layer 1 so as to be connected to the via conductor V.

The related-art wiring substrate may function as, for example, a multilayer wiring substrate by providing the via conductor V in the via conductor hole VH.

The related-art wiring substrate may be provided in a structure in which one via conductor V and one thin-film conductor layer T correspond to each other.

Specifically, as illustrated in FIG. 2A, the thin-film conductor layer T may be provided on the surface of the resin insulating layer 1. The thin-film conductor layer T may be provided on at least one surface of the resin insulating layer 1. In the anodic aluminum oxide structure according to the exemplary embodiment of the present disclosure, as an example, it is described that the thin-film conductor layer T is provided on each of upper and lower surfaces of the resin insulating layer 1. In this case, the thin-film conductor layers T may be composed of a first thin-film conductor layer T1 provided on the upper surface of the resin insulating layer 1 and a second thin-film conductor layer T2 provided on the lower surface of the resin insulating layer 1.

As illustrated in FIG. 2A, in the related-art wiring substrate, the conductor part C may have a structure in which one thin-film conductor layer T and one via conductor V are connected to each other.

The via conductor hole VH may be limited in size due to its processing method. For example, when the via conductor hole VH is formed with the diameter R1 and the diameter R1 is the smallest diameter that can be obtained by a mechanical processing method, the via conductor hole VH has a limitation to be formed with a diameter equal to or less than R1.

Therefore, the conductor part C may be limited to the structure in which one via conductor V is connected to one thin-film conductor layer T.

However, as illustrated in FIG. 2B, the anodic aluminum oxide structure according to the exemplary embodiment of the present disclosure may include the vertical conductive parts 12 each composed of a plurality of tiny conductive parts 12a so as to be connected to one surface conductive part S.

The anodic aluminum oxide structure according to the exemplary embodiment of the present disclosure is made of anodic aluminum oxide AAO, and may include a conductive part ES composed of the surface conductive part S provided on a surface of the anodic aluminum oxide AAO, and the vertical conductive parts 12 connected to the surface conductive part S and charged in each of the through-holes H of the anodic aluminum oxide AAO.

In this case, each of the vertical conductive parts 12 may be composed of a cluster of the plurality of tiny conductive parts 12a.

As illustrated in FIG. 2B, the conductive part ES may have a structure in which the vertical conductive parts 12 are each composed of the plurality of tiny conductive parts 12a so as to be connected to one surface conductive part S. In other words, the conductive part ES of the anodic aluminum oxide structure according to the exemplary embodiment of the present disclosure may have a structure in which a plurality of vertical conductive parts (specifically, the tiny conductive parts 12a) are connected to one surface conductive part S.

The surface conductive part S may be provided on at least one surface of the anodic aluminum oxide AAO. In the anodic aluminum oxide structure according to the exemplary embodiment of the present disclosure, as an example, it is described that the surface conductive part S is provided on each of upper and lower surfaces of the anodic aluminum oxide AAO.

In this case, the respective surface conductive parts S may be composed of a first surface conductive part 10 provided on a first surface of the anodic aluminum oxide AAO and a second surface conductive part 11 provided on a second surface of the anodic aluminum oxide AAO. As an example of an anodic aluminum oxide structure according to the exemplary embodiment of the present disclosure, the first surface of the anodic aluminum oxide AAO may be an upper surface of the anodic aluminum oxide AAO, and the second surface thereof may be a lower surface of the anodic aluminum oxide AAO.

The vertical conductive parts 12 charged in the through-holes H may be connected to the first and second surface conductive parts S.

As illustrated in FIG. 2B, the anodic aluminum oxide structure according to the exemplary embodiment of the present disclosure may include the plurality of tiny conductive parts 12a between the first and second surface conductive parts S.

In the anodic aluminum oxide structure according to the exemplary embodiment of the present disclosure, the through-holes H for having the tiny conductive parts 12a therein may be formed to have small diameters. The anodic aluminum oxide structure according to the exemplary embodiment of the present disclosure is not limited in the shape, size, and structure of the through-holes H. Therefore, the number of the plurality of through-holes H may be determined according to the number of the tiny conductive parts 12a to be provided.

As an example, the plurality of through-holes H may be formed within a size equal to that of the cross-sectional area having the diameter R1, which is the diameter of the via conductor hole VH illustrated in FIG. 2A. Therefore, each of the plurality of through-holes H may have a diameter smaller than the diameter R1.

As a result, each of the plurality of tiny conductive parts 12a may have a diameter smaller than that of the via conductor V, and all the tiny conductive parts 12a may be connected to one surface conductive part S.

The structure of the conductive part ES as illustrated in FIG. 2B may be advantageous in terms of preventing the interlayer delamination problem of the anodic aluminum oxide structure.

Specifically, the via conductor hole VH illustrated in FIG. 2A and the through-holes H illustrated in FIG. 2B may be configured to have different diameters and the same height h. Therefore, the via conductor V provided in the via conductor hole VH and the tiny conductive parts 12a provided in the through-holes H may have different diameters and the same height h.

Due to the fact that the via conductor V and the tiny conductive parts 12a may have the same height h, but have different diameters, the via conductor V and the tiny conductive parts 12a may have different volumes.

For example, when the cross-sectional area of the via conductor V having the diameter R1 is 'A1', and the cross-sectional area of each of the tiny conductive parts 12a having the diameter R2 smaller than R1 is 'A2', the via conductor V has a volume 'V1' larger than a volume 'V2' of the tiny conductive part 12a.

In this case, the conductor part C having the via conductor V having the volume V1 and the conductive part ES having the plurality of tiny conductive parts 12a each having the volume V2 may undergo thermal expansion when exposed to the same high-temperature atmosphere.

The via conductor V and the resin insulating layer 1 existing in the vicinity of the via conductor V have a difference in coefficient of thermal expansion. The coefficient of thermal expansion of the via conductor V may be greater than that of the resin insulating layer 1 made of a resin material. When the same high-temperature atmosphere, the via conductor V and the resin insulating layer 1 are exposed to the same high-temperature atmosphere, the difference in coefficient of thermal expansion occurs therebetween. In this case, stress is generated in the resin insulating layer 1 existing in the vicinity of the via conductor V due to thermal expansion of the via conductor V.

As illustrated in FIG. 2A, each of the thin-film conductor layers T may have a cross-sectional area larger than that of the via conductor V and may be connected to a first end and a second end of the via conductor V. In this case, the thin-film conductor layer T may be configured so that non-contact regions that are not in contact with the via conductor V are joined to the resin insulating layer 1.

In such a structure, when the via conductor V thermally expands, stress is generated in the resin insulating layer 1 in the vicinity of the via conductor V, resulting that the thin-film conductor layer T is delaminated from junction interfaces between the thin-film conductor layer T and the resin insulating layer 1.

However, in the anodic aluminum oxide structure according to the exemplary embodiment of the present disclosure, by providing the vertical conductive parts 12 each composed of the plurality of tiny conductive parts 12a each having a small volume, it is possible to reduce an overall volume expansion rate of the vertical conductive parts 12 due to thermal expansion. This may solve the problem of delamination of the thin-film conductor layer T provided on the surface of the anodic aluminum oxide structure.

Specifically, as illustrated in FIG. 2B, the anodic aluminum oxide structure according to the exemplary embodiment of the present disclosure may include the plurality of tiny conductive parts 12*a* each having a volume smaller than that of the via conductor V illustrated in FIG. 2A.

The anodic aluminum oxide structure according to the exemplary embodiment of the present disclosure may include the surface conductive parts S provided on a first surface thereof as an upper surface and a second surface thereof as a lower surface so as to be connected to the plurality of tiny conductive parts 12*a*.

Each of the plurality of tiny conductive parts 12*a* may be configured so that a projection region with respect to the surface conductive parts S is positioned inside the surface conductive parts S, so that all the tiny conductive parts 12*a* may be connected to one surface conductive part S. In other words, each of the plurality of tiny conductive parts 12*a* may be configured so that the area of the projection region with respect to the surface conductive parts S is equal to or less than that of each of the surface conductive parts S. Therefore, the conductive part ES may have a structure in which one surface conductive part S and the plurality of tiny conductive parts 12*a* are connected to each other.

Each of the surface conductive part S may be configured so that non-contact regions that are not in contact with the tiny conductive parts 12*a* are joined to the anodic aluminum oxide AAO. The anodic aluminum oxide structure according to the exemplary embodiment of the present disclosure may include the conductive part ES in a structure in which one surface conductive part S is connected to first ends of the plurality of tiny conductive parts 12*a* and one surface conductive part S is connected to second ends thereof.

In such a structure, the conductive part ES of the anodic aluminum oxide structure according to the exemplary embodiment of the present disclosure may be exposed to the same high-temperature atmosphere as the related-art conductor part C. As a result, the tiny conductive parts 12*a* may thermally expand.

Since the anodic aluminum oxide structure according to the exemplary embodiment of the present disclosure may include the through-holes H each having a small size, the tiny conductive parts 12*a* each having a very small volume may be provided. Therefore, even when the volume of each of the tiny conductive parts 12*a* expands due to temperature under a high-temperature atmosphere, the amount of the expansion may be small in proportion to the small volume.

This may minimize stress applied to the anodic aluminum oxide AAO existing in the vicinity the tiny conductive parts 12*a* due to thermal expansion of the tiny conductive parts 12*a*. As a result, damage to the anodic aluminum oxide AAO due to thermal expansion of the tiny conductive parts 12*a* may be prevented.

In addition, the plurality of tiny conductive parts 12*a* simultaneously expand in volume due to high temperature, but a volume expansion rate due to thermal expansion is small in proportion to the small volumes. Therefore, the overall volume expansion rate of the vertical conductive parts 12 due to thermal expansion may be smaller than that of the via conductor V illustrated in FIG. 2A. This may minimize stress generated by the surface conductive parts S connected to the vertical conductive parts 12. As a result, the anodic aluminum oxide structure according to the exemplary embodiment of the present disclosure may be prevented from experiencing a problem in which the surface conductive parts S are delaminated from the surfaces of the anodic aluminum oxide AAO.

In other words, in the anodic aluminum oxide structure according to the exemplary embodiment of the present disclosure, by the provision of the tiny conductive parts 12*a*, the overall volume expansion rate of the vertical conductive parts 12 may be reduced. Therefore, stress generated in the surface conductive parts S due to volume expansion of the vertical conductive parts 12 may be reduced.

This may solve the problem in which the surface conductive parts S are delaminated from junction interfaces between the anodic aluminum oxide AAO and the surface conductive parts S. In addition, the anodic aluminum oxide structure according to the exemplary embodiment of the present disclosure may be prevented from experiencing a problem of delamination between another anodic aluminum oxide AAO provided on each of the surface conductive parts S.

As described above, in the anodic aluminum oxide structure according to the exemplary embodiment of the present disclosure, by providing the through-holes H without size limitation, a structure capable of minimizing the amount of thermal expansion of the vertical conductive parts 12 may be formed. As a result, the anodic aluminum oxide structure according to the exemplary embodiment of the present disclosure may be implemented in an advantageous structure in terms of solving the interlayer delamination problem.

In other words, in the anodic aluminum oxide structure according to the exemplary embodiment of the present disclosure, the vertical conductive parts 12 each composed of the plurality of tiny conductive parts 12*a* may be provided by using the advantage of providing the through-holes H without a limitation on shape, size, and structure.

When each of the vertical conductive parts 12 are composed of the plurality of tiny conductive parts 12*a*, an overall volume expansion amount according to the thermal expansion rate due to temperature may be reduced. Therefore, the anodic aluminum oxide structure according to the exemplary embodiment of the present disclosure may be prevented from experiencing a problem in which a member (e.g., the surface conductive part S or the photosensitive material) provided on the vertical conductive parts 12 is delaminated from the junction interfaces in response to stress due to thermal expansion.

The anodic aluminum oxide structure according to the exemplary embodiment of the present disclosure may include the through-holes H formed without a limitation on shape and structure as well as size. Therefore, the anodic aluminum oxide structure according to the exemplary embodiment of the present disclosure may be implemented in a structure having excellent electrical conductivity.

In the anodic aluminum oxide structure according to the exemplary embodiment of the present disclosure, when the vertical conductive parts 12 are provided by charging a metal material in the through-holes H, electrical conductivity may vary depending on the shape, cross-sectional area size, and structure of the through-hole H.

FIGS. 3A, 3B, 4A, and 4B are views illustrating various embodiments of a through-hole of the anodic aluminum oxide structure according to the exemplary embodiment of the present disclosure.

Figure 3A:
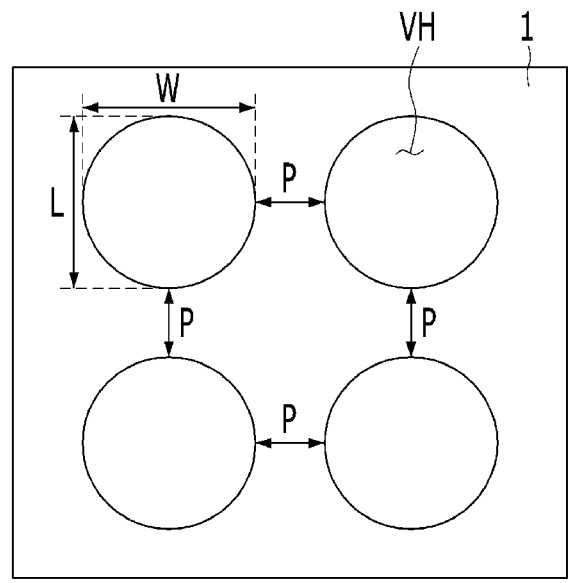
FIGS. 3A, 3B, 4A, and 4B are views illustrating various embodiments of a through-hole of the anodic aluminum oxide structure according to the present disclosure.
Figure 3B:
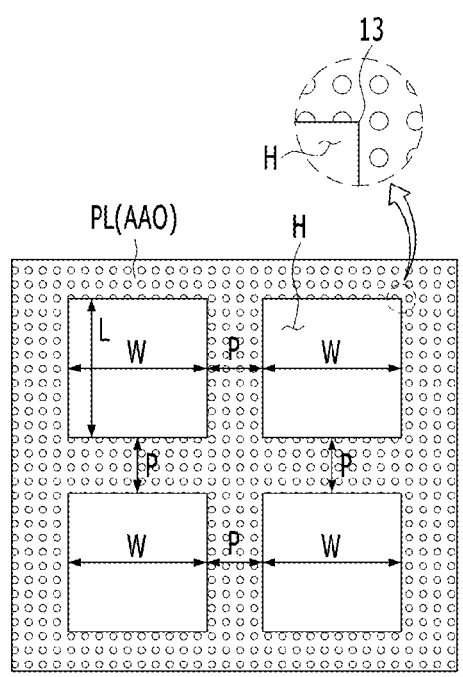

FIGS. 3A and 3B illustrate a comparison of a via conductor hole VH formed by a conventional mechanical processing method and a through-hole H formed by etching the anodic aluminum oxide structure according to the exemplary embodiment of the present disclosure in order to explain electrical conductivity that varies depending on the shape and cross-sectional area size of the through-hole H.

FIG. 3A is a view illustrating via conductor holes VH formed by the conventional mechanical hole processing method as viewed from above, and FIG. 3B is a view illustrating through-holes H formed by etching the anodic aluminum oxide structure according to the exemplary embodiment of the present disclosure as viewed from above.

A via conductor V may be provided in each of the via conductor hole VH illustrated in FIG. 3A, and a tiny conductive part 12a may be provided in each of the through-holes H illustrated in FIG. 3B. Alternatively, a single vertical conductive part 12 including an angled edge 13 may be provided in each of the through-holes H. In FIGS. 3A and 3B, as an example, it is described that a cluster of tiny conductive parts 12a is provided in each of the through-holes H to constitute a vertical conductive part 12 in the anodic aluminum oxide structure.

As illustrated in FIGS. 3A and 3B, as an example, each of the via conductor holes VH illustrated in FIG. 3A and each of the through-holes H illustrated in FIG. 3B have the same horizontal width W and vertical width L, and the via conductor holes VH and the through-holes H may be formed with the same pitch interval P in column and row directions.

In this case, as illustrated in FIG. 3A, the via conductor hole VH may be formed to have a circular cross-section, and as illustrated in FIG. 3B, the through-hole H may be formed to have a quadrangular cross-section.

Due to shape restriction experienced in the mechanical processing method, the via conductor hole VH may be formed to have a circular cross-section, or may be formed to have a shape that does not include an edge 13 where two surfaces meet. More specifically, the via conductor hole VH may have a circular cross-sectional shape or a cross-sectional shape in which two surfaces meet to form a round surface, and the two surfaces are continuously connected by the round surface. In FIG. 3A, as an example, it is described that the via conductor hole VH has a circular cross-section.

However, since the through-hole H is formed by etching, there is no restriction in shape. Therefore, even when the through-hole H has the same horizontal width W and vertical width L as the via conductor hole VH, the through-hole H may be formed to have a cross-section other than a circular cross-section.

As an example, the through-hole H may be formed to have a quadrangular cross-section having a larger cross-sectional area than the via conductor hole VH having a circular cross-section. The via conductor hole VH having a circular cross-section and the through-hole H having a quadrangular cross-section may be formed to have different cross-sectional area sizes even when having the same horizontal width W and vertical width L. When comparing the through-hole H having a quadrangular cross-section illustrated in FIG. 3B and the via conductor hole VH having a circular cross-section illustrated in FIG. 3A, the through-hole H having a quadrangular cross-section has a larger cross-sectional area than the via conductor hole VH having a circular cross-section.

In a multilayer wiring substrate, electrical conductivity of the vertical conductive part 12 may increase as the size of the cross-sectional area of a hole including a wiring part increases. Therefore, when comparing the structure including the tiny conductive parts 12a in the through-hole H and the structure including the via conductor V in the via conductor hole VH, electrical conductivity of the tiny conductive parts 12a in the through-hole H having a quadrangular cross-section may be higher than that of a via conductor V in the via conductor hole VH.

The anodic aluminum oxide structure according to the exemplary embodiment of the present disclosure is not limited in the shape, size, and structure of the through-holes H. Therefore, in the anodic aluminum oxide structure according to the exemplary embodiment of the present disclosure, each of the through-holes H may be formed in a cross-section having a cross-sectional area size capable of improving electrical conductivity of the vertical conductive part 12 therein.

As such, the anodic aluminum oxide structure according to the exemplary embodiment of the present disclosure may have the through-holes H each having a relatively larger cross-sectional area than each of the via conductor holes VH while having the same pitch distance P with the related-art via conductor holes VH. Therefore, the anodic aluminum oxide structure according to the exemplary embodiment of the present disclosure may include the tiny conductive parts 12a each having a larger cross-sectional area than the related-art via conductor V. As a result, the anodic aluminum oxide structure according to the exemplary embodiment of the present disclosure may be implemented in a structure having excellent electrical conductivity.

The through-holes H each having a quadrangular cross-section illustrated in FIG. 3B described above are illustrated as an example, and the shape, size, and structure of the through-holes H are not limited thereto. In realizing excellent electrical conductivity, there is no limitation on the shape of the through-holes H as long as each of the through-holes H has a shape with a circular cross-section or a shape with a larger cross-sectional area than each of the via conductor holes VH having a cross-section that does not include the edge 13 where the two surfaces meet.

Figure 4A:
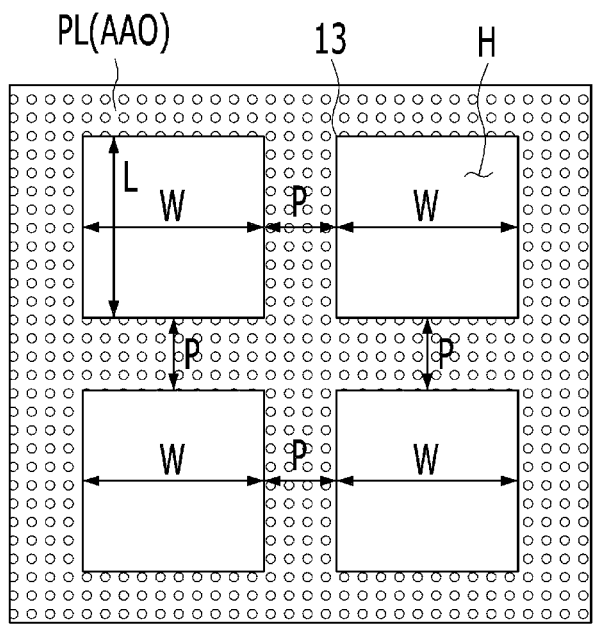
Figure 4B:
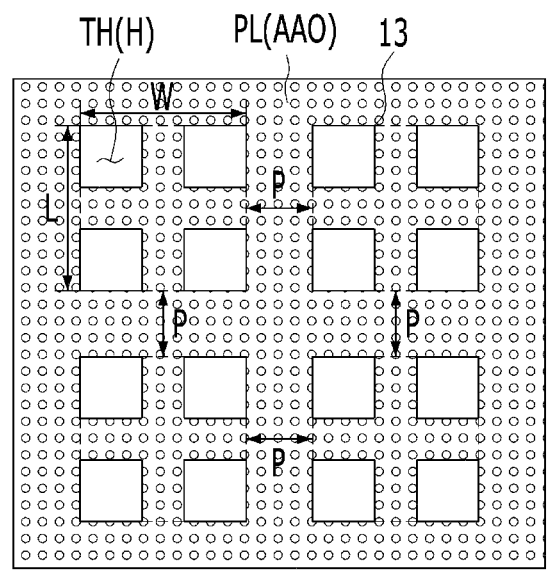

FIGS. 4A and 4B are views each illustrating another embodiment of a through-hole H of the anodic aluminum oxide structure according to the exemplary embodiment of the present disclosure.

FIG. 4A is a view illustrating through-holes H each having a quadrangular cross-section and having the same horizontal width W and vertical width L as viewed from above, and FIG. 4B is a view illustrating a plurality of tiny through-holes TH formed within a size equal to that of the cross-sectional area of each of the through-holes H illustrated in FIG. 4A as viewed from above. The tiny through-holes TH are included in a through-hole H, and may be through-holes H that are formed within a size corresponding to the size of the cross-sectional area of the through-hole H illustrated in FIG. 4A and have a cross-sectional area smaller than that of the through-hole H.

Since the anodic aluminum oxide structure according to the exemplary embodiment of the present disclosure is not limited in the shape and size of the through-hole H, a plurality of tiny through-holes TH each having a quadrangular cross-section may be provided.

In this case, each of the tiny through-holes TH may have a larger cross-sectional area than a circular cross-section compared to its small size. Therefore, when the anodic aluminum oxide structure according to the exemplary embodiment of the present disclosure includes the tiny through-holes TH having such a structure, coefficient of thermal expansion of a vertical conductive part 12 may be reduced due to the small sizes, thereby minimizing an interlayer delamination phenomenon.

In addition, the anodic aluminum oxide structure according to the exemplary embodiment of the present disclosure may include the small-sized through-hole H due to the tiny through-holes TH, but include the vertical conductive part 12 having a relatively large cross-sectional area, thus having excellent electrical conductivity.

Although FIGS. 4A and 4B illustrate that all the plurality of tiny through-holes TH have a rectangular cross-section, at least one of the plurality of tiny through-holes TH may have a quadrangular cross-section, and the remaining tiny through-holes TH may have a cross-section other than quadrangular.

When at least one of the tiny through-holes TH has a quadrangular cross-section, at least one of tiny conductive parts 12a provided in the tiny through-holes TH may include an angled edge 13.

FIGS. 5A to 8B are views each illustrating another embodiment of a through-hole H of the anodic aluminum oxide structure according to the exemplary embodiment of the present disclosure in which a vertical conductive part 12 is provided. In FIGS. 5A to 8B, as an example, it is described that anodic aluminum oxide AAO is configured to include a barrier layer BL and a porous layer PL, and the periphery of an opening of the through-hole H is closed by the barrier layer BL. However, the anodic aluminum oxide AAO may be configured with the barrier layer BL removed.

In this case, FIGS. 5A to 8B exemplarily illustrate through-holes H provided without a limitation on shape, size, and structure. Therefore, the shapes, sizes, and structures of the through-holes H and vertical conductive parts 12 provided in the through-holes H are not limited to the shapes, sizes, and structures illustrated in FIGS. 5A to 8B.

Figure 5A:
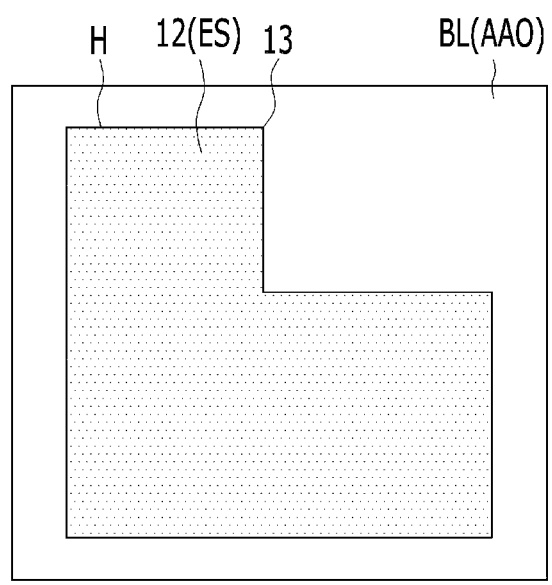
FIGS. 5A to 8B are views each illustrating a through-hole according to another embodiment of the present disclosure in which a vertical conductive part is provided.

As illustrated in FIG. 5A, a through-hole H may be formed in a shape having a plurality of edges 13 each where two surfaces meet. In this case, in FIG. 5A, it is described that the through-hole H is formed in an angled shape including six edges 13, but the number and shape of the edges 13 are not limited thereto.

Figure 5B:
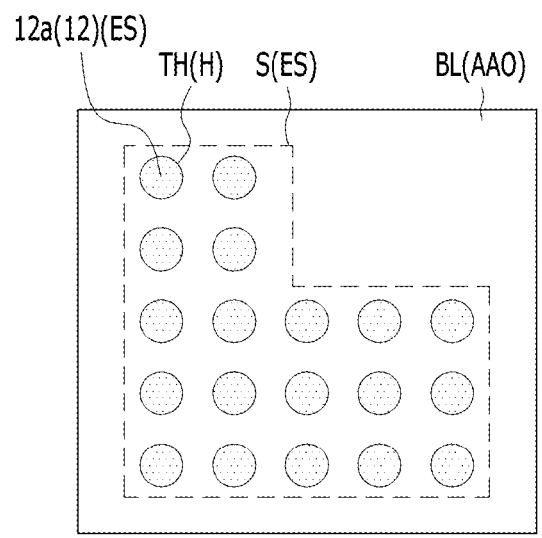

The anodic aluminum oxide structure according to the exemplary embodiment of the present disclosure may include a vertical conductive part 12 including the angled edges 13 by providing the vertical conductive part 12 in the through-hole H. FIG. 5B illustrates a plurality of tiny through-holes TH provided within a size equal to that of the cross-sectional area of the through-hole H including the six edges 13 illustrated in FIG. 5A.

The plurality of tiny through-holes TH may be formed in a cluster. In this case, the plurality of tiny through-holes TH may be formed with a predetermined pitch interval P, and at least two thereof may be formed with different pitch intervals P.

Each of the tiny through-holes TH may have a tiny conductive part 12a therein, and the respective tiny conductive parts 12a may be formed in a cluster to constitute a vertical conductive part 12.

When the vertical conductive part 12 is composed of the cluster of tiny conductive parts 12a, an overall volume expansion amount of the vertical conductive part 12 due to temperature may be reduced. This may be advantageous in terms of solving an interlayer delamination problem of the anodic aluminum oxide structure.

The vertical conductive part 12 composed of the plurality of tiny conductive parts 12a may be connected to one surface conductive part S. In this case, a projection region of the plurality of tiny conductive parts 12a with respect to the surface conductive part S may be positioned inside the surface conductive part S.

Although FIG. 5B illustrates as an example that the surface conductive part S is formed in a shape corresponding to a shape in which the plurality of tiny conductive parts 12a form a cluster, the shape of the surface conductive part S is not limited thereto. Specifically, there is no limitation on the shape and structure of the surface conductive part S as long as the area of the surface conductive part S is larger than that of the projection region of the plurality of tiny conductive parts 12a with respect to the surface conductive part S.

Although FIG. 5B illustrates as an example that each of the tiny through-holes TH has a circular cross-section, the shape of the cross-section of the tiny through-hole TH is not limited thereto.

Specifically, the anodic aluminum oxide structure may include a through-hole H including a tiny through-hole TH having a quadrangular cross-section and a tiny through-hole TH having a cross-section (e.g., a circular cross-section) other than quadrangular.

At least two of the tiny conductive parts 12a provided in the through-hole H may have different shapes. Therefore, at least two of the tiny conductive parts 12a provided in the through-hole H may have different cross-sectional area sizes.

Figure 6A:
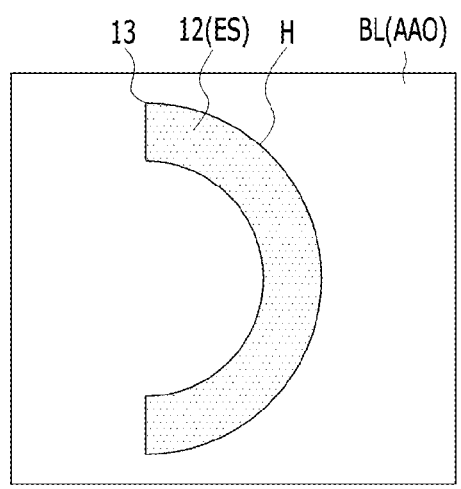

As illustrated in FIG. 6A, a through-hole H may be formed in a shape having a semicircular strip-shaped cross-section including an edge 13 and a curved surface.

In this case, the through-hole H may be formed in a semicircular strip shape in which two curved surfaces of different arc lengths are provided in parallel, and each of the curved surfaces meets two vertical surfaces connecting the two curved surfaces to each other to form four edges 13.

The anodic aluminum oxide structure according to the exemplary embodiment of the present disclosure is not limited in shape in forming the through-hole H. Therefore, as illustrated in FIG. 6A, the through-hole H may have a shape including the edges 13 each where the two surfaces meet and portions (e.g., the curved surfaces) that do not include the edges 13.

The anodic aluminum oxide structure according to the exemplary embodiment of the present disclosure may include a vertical conductive part 12 including the angled edges 13 by providing the vertical conductive part 12 in the through-hole H.

Figure 6B:
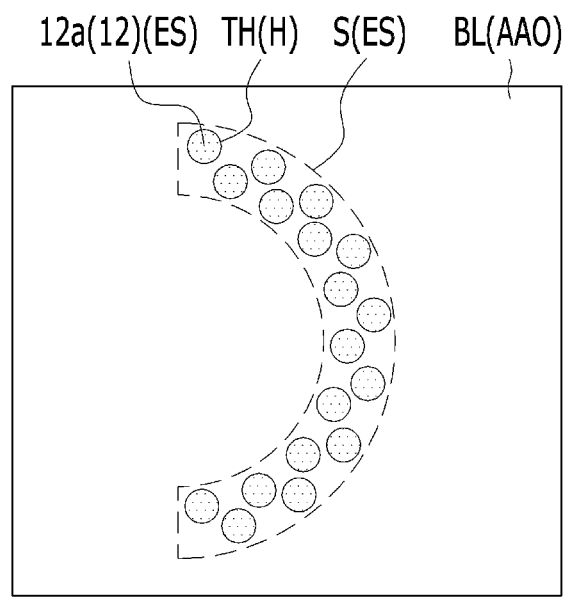

FIG. 6B illustrates a plurality of tiny through-holes TH provided within a size equal to that of the cross-sectional area of the through-hole H having a semicircular strip-shaped cross-section illustrated in FIG. 5A.

The plurality of tiny through-holes TH may be formed in a cluster within the area having a size equal to that of the cross-sectional area of the through-hole H having a semicircular strip-shaped cross-section. In this case, the plurality of tiny through-holes TH may be formed with a predetermined pitch interval P, and at least two thereof may be formed with different pitch intervals P.

Each of the tiny through-holes TH may have a tiny conductive part 12a therein, and the respective tiny conductive parts 12a may be formed in a cluster according to a clustered shape of the tiny through-holes TH. The cluster of tiny conductive parts 12a may constitute a vertical conductive part 12.

The vertical conductive part 12 may be connected to one surface conductive part S. In this case, a projection region of the plurality of tiny conductive parts 12a with respect to the surface conductive part S may be positioned inside the surface conductive part S.

The surface conductive part S may be formed in a shape corresponding to a shape in which the plurality of tiny conductive parts 12a form a cluster, and the shape is not limited thereto. Specifically, there is no limitation on the shape and structure of the surface conductive part S as long as the area of the surface conductive part S is larger than that of the projection region of the plurality of tiny conductive parts 12a with respect to the surface conductive part S.

Although FIG. 6B illustrates as an example that each of the tiny through-holes TH has a circular cross-section, the shape of the cross-section of the tiny through-hole TH is not limited thereto.

Specifically, the anodic aluminum oxide structure may include a through-hole H including a tiny through-hole TH having a quadrangular cross-section and a tiny through-hole TH having a cross-section (e.g., a circular cross-section) other than quadrangular.

Figure 7A:
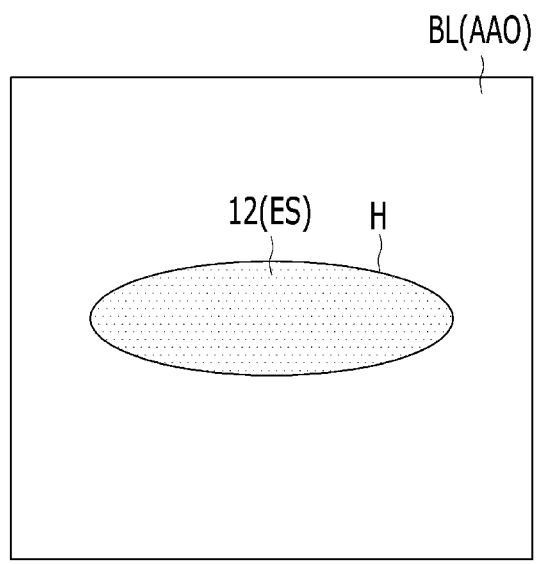

As illustrated in FIG. 7A, a through-hole H may be formed in a shape having an elliptical cross-section.

Figure 7B:
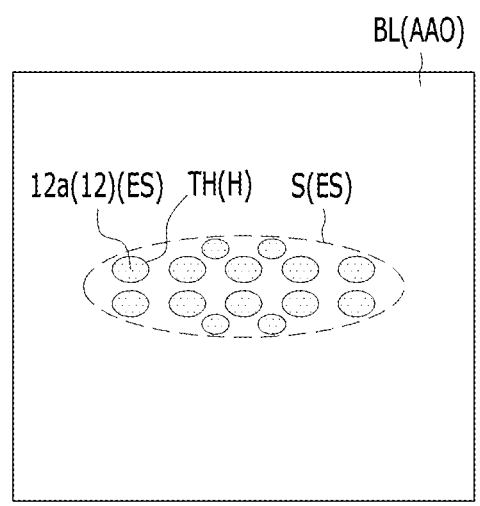

FIG. 7B illustrates a plurality of tiny through-holes TH provided within a size equal to that of the cross-sectional area of the through-hole H having an elliptical cross-section illustrated in FIG. 7A.

The plurality of tiny through-holes TH may be formed in a cluster. In this case, the plurality of tiny through-holes TH may be formed with a predetermined pitch interval P, and at least two thereof may be formed with different pitch intervals P.

Each of the tiny through-holes TH may have a tiny conductive part 12a therein, and the respective tiny conductive parts 12a may be formed in a cluster to constitute a vertical conductive part 12.

As illustrated in FIG. 7B, at least two of the tiny through-holes TH may be formed to have different cross-sectional area sizes.

Although FIG. 7B illustrates as an example that each of the tiny through-holes TH has a circular cross-section, the shape of the cross-section of the tiny through-hole TH is not limited thereto.

Specifically, the anodic aluminum oxide structure may include a through-hole H including a tiny through-hole TH having a quadrangular cross-section and a tiny through-hole TH having a cross-section (e.g., a circular cross-section) other than quadrangular. Therefore, at least two of the respective tiny conductive parts 12a provided in the through-hole H may have different shapes.

Figure 8A:
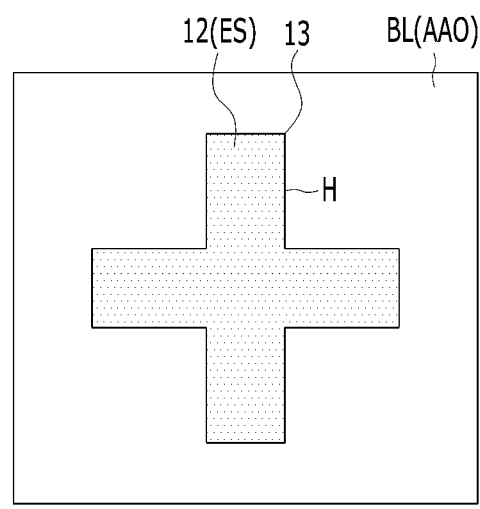

As illustrated in FIG. 8A, a through-hole H may be formed in a shape having a cross-shaped cross-section including 12 edges 13. This exemplarily illustrates the through-hole H formed without a limitation on shape, and thus the shape of the through-hole H is not limited thereto.

As illustrated in FIG. 8A, the through-hole H may be formed in a cross shape in which 12 vertical surfaces form a cross shape so that the respective vertical surfaces meet to form 12 edges 13.

Figure 8B:
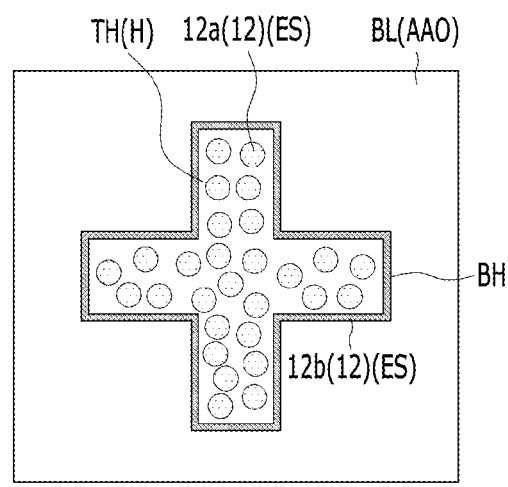

The anodic aluminum oxide structure according to the exemplary embodiment of the present disclosure may include a vertical conductive part 12 including the angled edges 13 by providing the vertical conductive part 12 in the through-hole H. FIG. 8B illustrates a plurality of tiny through-holes TH provided within a size equal to that of the cross-sectional area of the through-hole H illustrated in FIG. 8A.

The plurality of tiny through-holes TH may be formed in a cluster within the area having a size equal to that of the cross-sectional area of the through-hole H having a cross-shaped cross-section shown in FIG. 8A. In this case, the plurality of tiny through-holes TH may be formed with a predetermined pitch interval P, and at least two thereof may be formed with different pitch intervals P.

Each of the tiny through-holes TH may have a tiny conductive part 12a therein. The cluster of tiny conductive parts 12a may constitute a vertical conductive part 12.

As illustrated in FIG. 8B, the vertical conductive part 12 may include a border conductive part 12b surrounding the tiny conductive parts 12a at a position outside the same.

In the anodic aluminum oxide structure according to the exemplary embodiment of the present disclosure, the through-hole H may be formed without a limitation on shape, size, and structure. Therefore, as illustrated in FIG. 8B, a border through-hole BH may be formed to surround the clustered tiny conductive parts 12a at a position outside the same.

Since the border through-hole BH may be formed outside the tiny conductive parts 12a according to a clustered shape of the cross-shaped tiny conductive parts 12a, the border through-hole BH may have a cross shape.

The border through-hole BH may have the border conductive part 12b therein. The border conductive part 12b may be formed to include edges 13 by the border through-hole BH formed in a cross shape.

The vertical conductive part 12 may include the clustered tiny conductive parts 12a and the border conductive part 12b surrounding the tiny conductive parts 12a at a position outside the same.

In this case, a surface conductive part S connected to the vertical conductive part 12 may have an area larger than a projection area of the tiny conductive parts 12a and the border conductive part 12b with respect to the surface conductive part S.

As such, by providing the through-holes H without a limitation on shape, size, and structure, the anodic aluminum oxide structure according to the exemplary embodiment of the present disclosure may be implemented in an effective structure to prevent the interlayer delamination problem, or in a structure having excellent electrical conductivity as necessary.

As described above, the present disclosure has been described with reference to the exemplary embodiments. However, those skilled in the art will appreciate that various modifications, additions and substitutions are possible, without departing from the scope and spirit of the present disclosure as disclosed in the accompanying claims.

What is claimed is:

1. An anodic aluminum oxide structure made of anodic aluminum oxide, the anodic aluminum oxide structure comprising:
 a plurality of tiny through-holes vertically formed by patterning photosensitive material and performing an etching process on the anodic aluminum oxide, the anodic aluminum oxide including a plurality of pores;
 a plurality of tiny conductive parts formed by charging a metal material in the plurality of tiny through-holes of the anodic aluminum oxide;
 a first surface conductive part provided on a first surface of the anodic aluminum oxide and electrically connected to a first end of a cluster of the plurality of tiny conductive parts; and
 a second surface conductive part provided on a second surface of the anodic aluminum oxide and electrically connected to a second end of the cluster of the plurality of tiny conductive parts,
 wherein each of the plurality of tiny through-holes has a vertical inner wall,
 wherein the plurality of tiny through-holes are spaced from each other, and
 wherein each of the plurality of tiny conductive parts are separated from each other by the vertical inner wall.

2. The anodic aluminum oxide structure of claim 1, wherein at least one of the plurality of tiny conductive parts comprises an angled edge.

3. The anodic aluminum oxide structure of claim 1, wherein a projection region of the plurality of tiny conductive parts with respect to the first surface conductive part is positioned inside the first surface conductive part.

4. The anodic aluminum oxide structure of claim 1, wherein an area of a projection region of the plurality of tiny conductive parts with respect to the first surface conductive part is equal to or less than that of the first surface conductive part.

5. The anodic aluminum oxide structure of claim 1, further comprising a border conductive part surrounding the plurality of tiny conductive parts at a position outside the plurality of tiny conductive parts.

6. The anodic aluminum oxide structure of claim 1, wherein at least two of the plurality of tiny conductive parts have different cross-sectional sizes.

7. The anodic aluminum oxide structure of claim 1, wherein at least two of the plurality of tiny conductive parts have different shapes.

* * * * *